(12) United States Patent
Strydom (10) Patent No.: US 11,082,033 B2
(45) Date of Patent: Aug. 3, 2021

(54) RAPID AND HIGH VOLTAGE PULSE GENERATION CIRCUITS

(71) Applicant: TEXAS INSTRUMENTS INCORPORATED, Dallas, TX (US)

(72) Inventor: Johan Tjeerd Strydom, Saratoga, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/078,623

(22) Filed: Oct. 23, 2020

(65) Prior Publication Data

US 2021/0126629 A1 Apr. 29, 2021

Related U.S. Application Data

(60) Provisional application No. 62/926,232, filed on Oct. 25, 2019.

(51) Int. Cl.
*H03K 4/04* (2006.01)
*H03K 5/01* (2006.01)

(52) U.S. Cl.
CPC ............... *H03K 4/04* (2013.01); *H03K 5/01* (2013.01)

(58) Field of Classification Search
CPC ............ H03K 4/04; H03K 5/01; H03K 17/04; H03K 17/041; H03K 17/04106; H03K 17/04113; H03K 17/0416; H03K 17/04163; H03K 17/04166; H03K 3/012; H03K 3/26; H03K 3/353

USPC ................ 327/304, 108–112; 326/82, 83, 87
See application file for complete search history.

(56) References Cited

U.S. PATENT DOCUMENTS

| | | | | |
|---|---|---|---|---|
| 7,432,670 | B2* | 10/2008 | Yamashita | H05B 41/2882 315/362 |
| 2006/0076986 | A1* | 4/2006 | Chan | H02M 3/3378 327/112 |
| 2012/0286868 | A1* | 11/2012 | Haroun | H03F 1/26 330/251 |
| 2015/0069855 | A1* | 3/2015 | De Rooij | H03F 3/2171 307/104 |
| 2016/0191053 | A1* | 6/2016 | Esmaeili | H03K 17/567 327/109 |
| 2018/0097447 | A1* | 4/2018 | Iorio | H02M 1/08 |
| 2019/0372467 | A1* | 12/2019 | Ito | H03K 17/04123 |

* cited by examiner

*Primary Examiner* — Tomi Skibinski
(74) *Attorney, Agent, or Firm* — Michael A. Davis, Jr.; Charles A. Brill; Frank D. Cimino (57) ABSTRACT

In some examples, a circuit comprises a first switch adapted to be coupled to a direct current (DC) power source, a second switch coupled to the first switch and adapted to be coupled to the DC power source, and a resistor coupled to the first and second switches. The circuit comprises a transformer having a primary side and a secondary side, the primary side coupled to the first and second switches, the secondary side adapted to be coupled to a load. The circuit comprises a third switch coupled between the resistor and the primary side of the transformer, and a capacitor coupled to the second switch.

20 Claims, 9 Drawing Sheets

RAPID AND HIGH VOLTAGE PULSE GENERATION CIRCUITS

CROSS-REFERENCE TO RELATED APPLICATIONS

The present application claims priority to U.S. Provisional Patent Application No. 62/926,232, which was filed Oct. 25, 2019, is titled "High Voltage Pulse Generation For Actuator/Capacitive Loads," and is hereby incorporated herein by reference in its entirety.

BACKGROUND

Some electronic devices call for high-amplitude voltage pulses that have fast rise times. For example, autonomous vehicles may use such voltage pulses to provide fast and powerful bursts of light in sensing applications.

SUMMARY

In some examples, a circuit comprises a first switch adapted to be coupled to a direct current (DC) power source, a second switch coupled to the first switch and adapted to be coupled to the DC power source, and a resistor coupled to the first and second switches. The circuit comprises a transformer having a primary side and a secondary side, the primary side coupled to the first and second switches, the secondary side adapted to be coupled to a load. The circuit comprises a third switch coupled between the resistor and the primary side of the transformer, and a capacitor coupled to the second switch.

DETAILED DESCRIPTION

As described above, various applications may benefit from the availability of high amplitude voltage pulses with fast rise times. However, existing solutions that are capable of generating such voltage pulses are suboptimal at least because they are inefficient and because they fail to control resonant activity, thereby producing ringing that lasts for inappropriately long periods of time.

This description presents various examples of a circuit that solves the challenges described above. The circuit is configured to provide high-amplitude voltage pulses with fast rise times. The circuit is configured to operate efficiently by recovering resonant energy from a resonant tank of the circuit that was unused in the generation of the high-amplitude voltage pulse. The circuit is configured to store such recovered resonant energy to its power source, such as a battery. Also, the circuit is configured to dampen ringing caused by any unrecovered resonant energy in the resonant tank. In this way, the circuit is configured to efficiently provide a high-amplitude voltage pulse with a fast rise time and little-to-no subsequent ringing effects. Such a circuit may find useful application in systems (e.g., battery-powered systems) that call for such voltage pulses, such as Lidar systems, autonomous vehicles, pockel cells, and a wide range of transducer applications including actuators and optical transducers.

Figure 1:
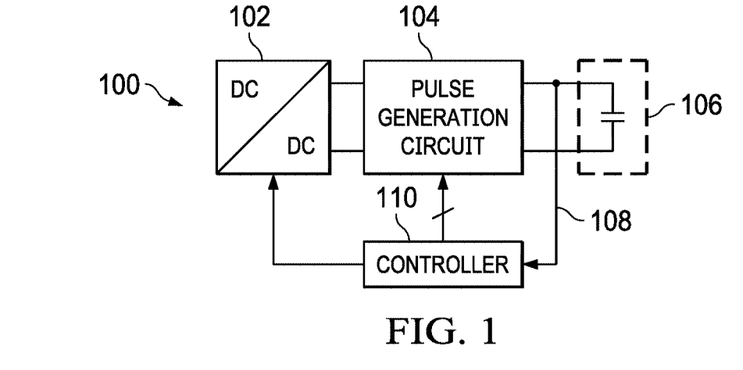
FIG. 1 is a block diagram of a system implementing a rapid and high voltage pulse generation circuit, in accordance with various examples.

FIG. 1 is a block diagram of a system 100 implementing a rapid and high voltage pulse generation circuit 104, in accordance with various examples. The system 100 includes a direct current (DC)-to-DC power source (hereinafter "DC power source") 102 and a circuit 104 adapted to be coupled to the DC power source 102. The system 100 also includes a capacitive load 106. The capacitive load 106 may be a simplified model of other loads, such as pockel cells or transducers. The circuit 104 is adapted to be coupled to the capacitive load 106. Load types other than capacitive loads (e.g., transducer loads) are contemplated and included in the scope of this description. The system 100 also includes a controller 110 coupled to the capacitive load 106 by way of an optional feedback connection 108 and coupled to the DC power source 102. The circuit 104 is adapted to be coupled to the controller 110. The controller 110 is configured to control aspects of the DC power source 102 and the circuit 104.

In operation, the DC power source 102 is configured to supply the circuit 104 with DC power. The circuit 104 includes multiple switches that are configured to open and close as controlled by the controller 110. By opening and/or closing these switches at appropriate times, the circuit 104 efficiently provides a high-amplitude voltage pulse with a fast rise time and little-to-no subsequent ringing effects. The circuit 104 provides the high-amplitude voltage pulse to the capacitive load 106. The controller 110 is configured to control the DC power source 102 as may be appropriate for a target application based on an output voltage across the capacitive load 106 as indicated by the optional feedback connection 108. The controller 110 may be configured to control the switches of the circuit 104 according to a fixed schedule. For example, the controller 110 may be configured to adjust the switches of the circuit 104 at predetermined times. An adaptive or trial-and-error process is useful to determine the fixed schedule according to which the controller 110 controls the switches. For example, the controller 110 may implement a fixed switching schedule that provides the signal behaviors shown in FIG. 8 and described below.

Figure 2:
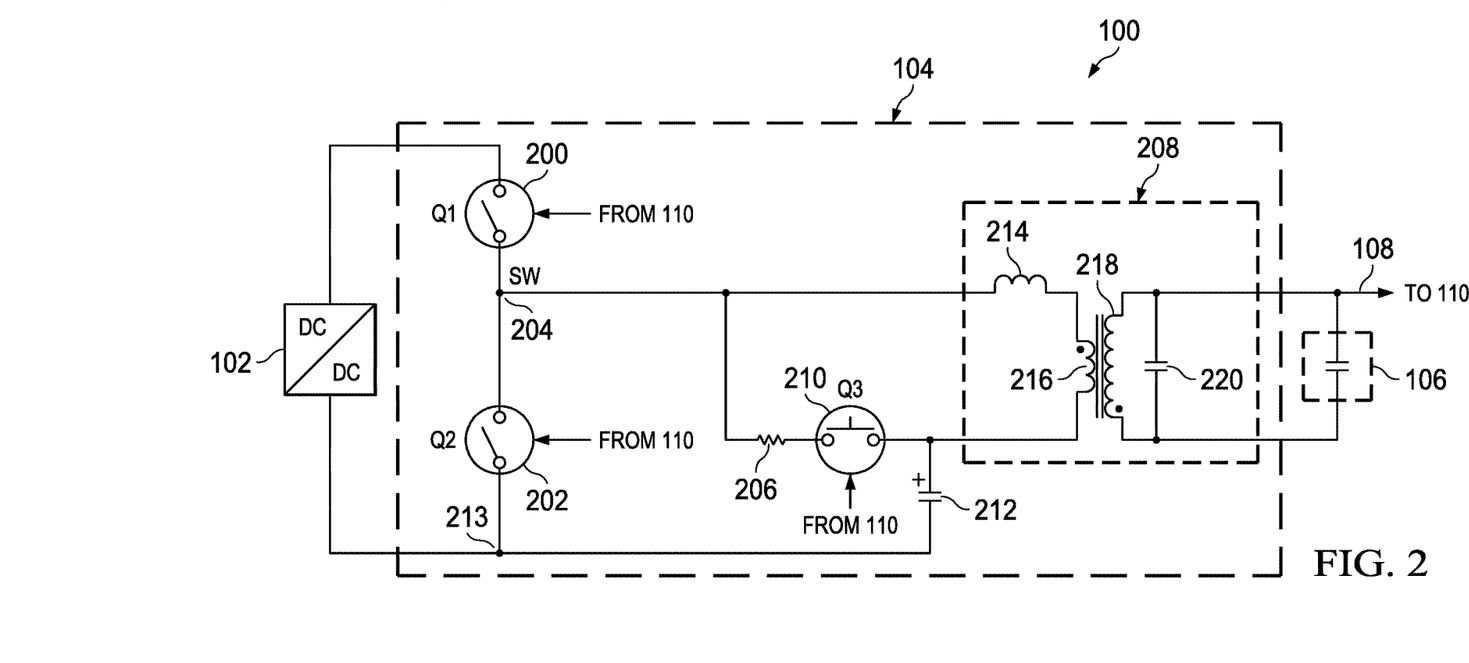
FIG. 2 is a circuit schematic diagram of a system implementing a rapid and high voltage pulse generation circuit, in accordance with various examples.

FIG. 2 is a circuit schematic diagram of the system 100 of FIG. 1, in accordance with various examples. The system 100 includes the DC power source 102, the circuit 104, and the capacitive load 106. The system 100 also includes the optional feedback connection 108 and the controller 110 of FIG. 1, but FIG. 2 does not expressly show these components for clarity and ease of understanding. In examples, the circuit 104 includes a switch 200 and a switch 202. The switches 200, 202 may be transistors. The switches 200, 202 may be field effect transistors (FETs). In examples, the switches 200, 202 are metal oxide semiconductor field effect transistors (MOSFETs). In examples, the switches 200, 202 are bi-polar junction transistors (BJTs). In examples, the switches 200, 202 are composed of wide bandgap semiconductors, such as gallium nitride or silicon carbide, that facilitate fast, low-voltage switching relative to narrow bandgap semiconductors. Control terminals of the switches 200, 202, such as gate terminals or base terminals, may couple to the controller 110 of FIG. 1. Each of the non-control terminals of each of the switches 200, 202, such as sources and drains in the case of FETs or collectors and emitters in the case of BJTs, may couple to the DC power source 102 and/or to a switching (SW) node 204.

The SW node 204 is coupled to a resistor 206 and to an isolation step-up transformer 208. The resistor 206 is coupled to a bidirectional switch 210. In examples, the bidirectional switch 210 is composed of two series-coupled transistors (e.g., FETs, MOSFETs, BJTs), each series-coupled transistor capable of blocking current in two directions and voltage in one direction. By including two such transistors in the bidirectional switch 210, voltage may be blocked in both directions (e.g., when the voltage differential across the pair of transistors is positive or negative, depending on the states of the switches 200, 202). Other types of bidirectional switches 210 are contemplated and included in the scope of this description. The controller 110 of FIG. 1 is configured to control the terminal(s) of the bidirectional switch 210. A capacitor 212 (e.g., a ceramic DC capacitor) is coupled to the bidirectional switch 210 and to the transformer 208. In examples, the capacitor 212 has a sufficiently high capacitance that it does not affect the resonant frequency of the system 100. In examples, the capacitor 212 is replaced by a voltage supply. The switch 202, the capacitor 212, and the DC power source 102 couple to each other at a node 213.

The transformer 208 includes an inductor 214 coupled in series with a primary side 216 (e.g., winding) of the transformer 208. The primary side 216 is coupled to the bidirectional switch 210 and the capacitor 212. The transformer 208 includes a secondary side 218, which in some examples is opposite in polarity relative to the primary side 216 and in other examples has the same polarity as the primary side 216. In examples, the secondary side 218 includes more windings than the primary side 216, as the transformer 208 is a step-up transformer. In examples, the secondary side 218 includes fewer windings than the primary side 216, in which case the transformer 208 is a step-down transformer. In yet other examples, the transformer 208 is a 1:1 transformer. A capacitor 220 couples in parallel to the secondary side 218 and in parallel to the capacitive load 106, as shown.

The inductor 214 represents a sum of one or more inductances that may be present between the SW node 204 and the primary side 216. Specifically, the inductor 214 may represent a leakage inductance introduced to the circuit 104 by the imperfect coupling of the primary and secondary sides of the transformer 208. Also, the inductor 214 may represent one or more additional inductors added in series and/or parallel between the SW node 204 and the primary side 216 to increase or decrease the total inductance above or below the leakage inductance introduced by the transformer 208. Similarly, the capacitor 220 may represent a parasitic capacitance introduced to the circuit 104 by the transformer 208. Also, the capacitor 220 may represent one or more capacitors added in series and/or parallel to decrease or increase the total capacitance below or above the parasitic capacitance introduced by the transformer 208. In this way, the total inductance represented by the inductor 214 may be fine-tuned, and similarly, the total capacitance represented by the capacitor 220 may be fine-tuned. Fine-tuning the inductance represented by the inductor 214 and/or the capacitance represented by the capacitor 220 may increase or decrease the resonant frequency of the system 100 (and, more specifically, of the resonant tank formed by the inductor 214 and the combined capacitors 220, 106, and system parasitic capacitances). Example implications of a change to the resonant frequency of the system 100 are described below.

Figure 8:
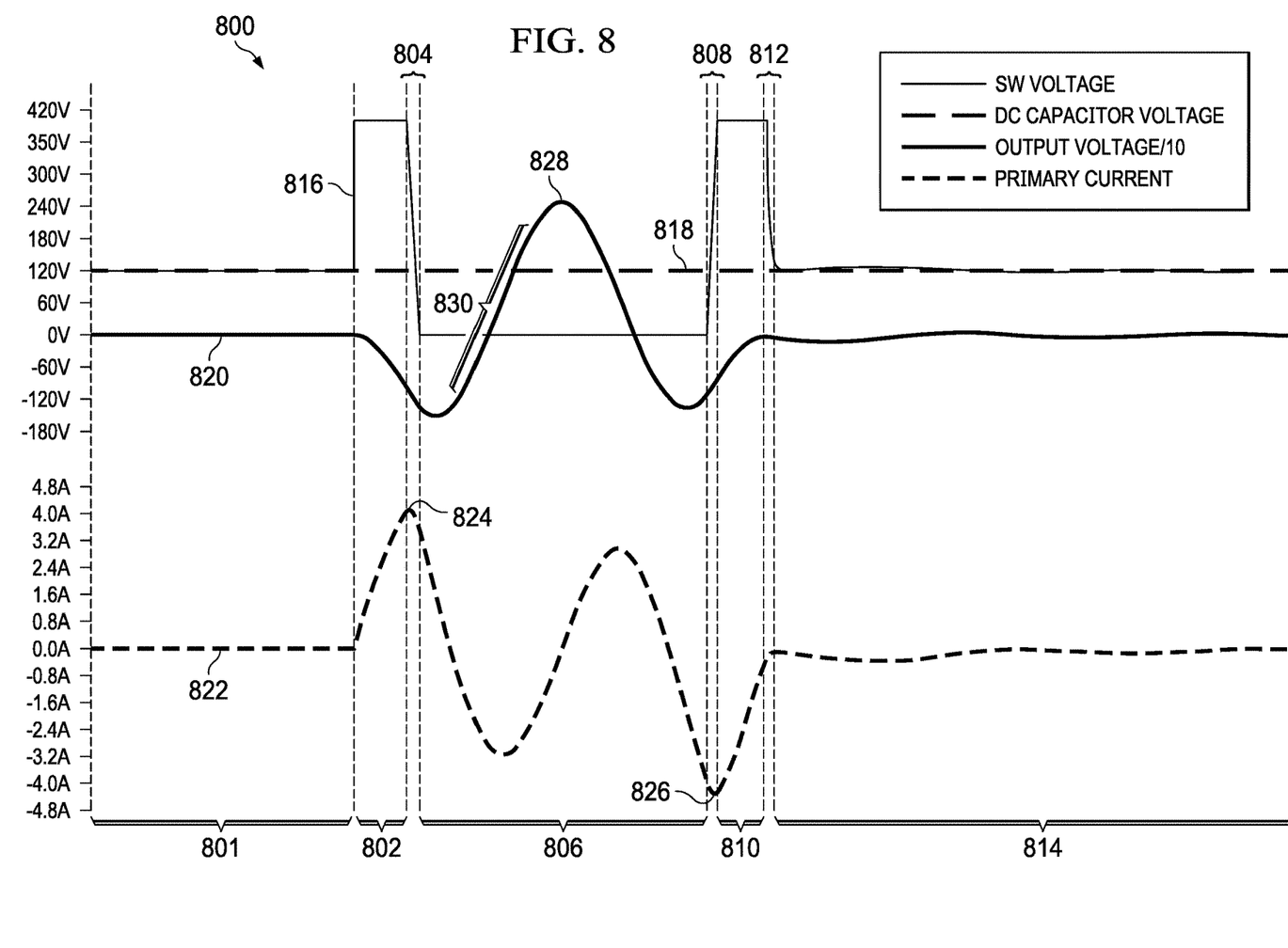
FIG. 8 is a graph showing the operation of a system implementing a rapid and high voltage pulse generation circuit, in accordance with various examples.
Figure 9:
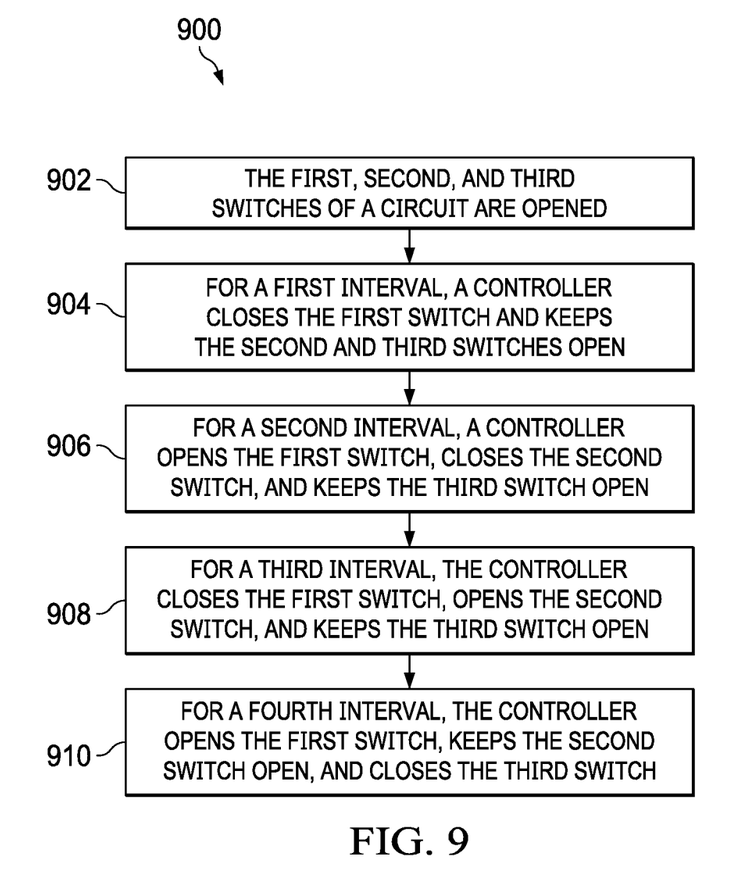
FIG. 9 is a flow diagram of a method for controlling the operation of a system implementing a rapid and high voltage pulse generation circuit, in accordance with various examples.

As described above, in some examples, the controller 110 (FIG. 1) opens and closes the switches 200, 202, 210 (FIG. 2) in accordance with a fixed schedule, thus causing the circuit 104 to efficiently provide a high-amplitude voltage pulse with a fast rise time. In other examples, the controller 110 uses the feedback connection 108 as appropriate to open and close the switches 200, 202, 210. The method 900 in FIG. 9 presents an example control scheme that the controller 110 may implement to control the switches 200, 202, 210 (e.g., according to the fixed schedule described above). FIGS. 3-6 are circuit schematic diagrams showing the operation of the system 100 (e.g., states of the switches 200, 202, 210) during different intervals or time periods of the method 900. FIG. 8 is a graph showing the signals provided at various nodes of the system 100 as the controller 110 implements the method 900. Accordingly, FIGS. 3-6, 8 and 9 are now described in parallel. In particular, the layout of the graph 800 of FIG. 8 is described first, followed by the parallel description of FIGS. 2-6, 8 and 9.

The graph 800 of FIG. 8 includes time (e.g., in microseconds) on the x-axis and voltage (e.g., in Volts) and current (e.g., in Amperes) on the y-axis. The x-axis is divided into different time intervals 801, 802, 804, 806, 808, 810, 812, and 814. The graph 800 includes a curve 816 that shows the voltage provided at the SW node 204, a curve 818 that shows the voltage provided by the capacitor 212, a curve 820 that shows a scaled-down version of the output voltage provided across the capacitive load 106 (e.g., the output voltage divided by 10), and a curve 822 that shows a current flowing through the SW node 204 and the primary side 216. The curve 822 includes a positive peak 824 and a negative peak 826. The curve 820 includes a positive peak 828.

Prior to performing the method 900, the capacitor 212 is charged to provide a steady bias DC voltage (or, alternatively, a voltage supply is substituted for the capacitor 212). The bias DC voltage mitigates any residual DC voltage across the transformer 208 per pulse. In examples, the vias DC voltage is tuned so that the curve 820 is symmetrical in time interval 806 around positive peak 828. Interval 801 of FIG. 8 shows this bias voltage, in which the curve 818 is steady at the bias voltage provided by the capacitor 212 (e.g., 120 V), the curve 820 is steady at 0 V, and the curve 822 is steady at 0 A.

Figure 3:
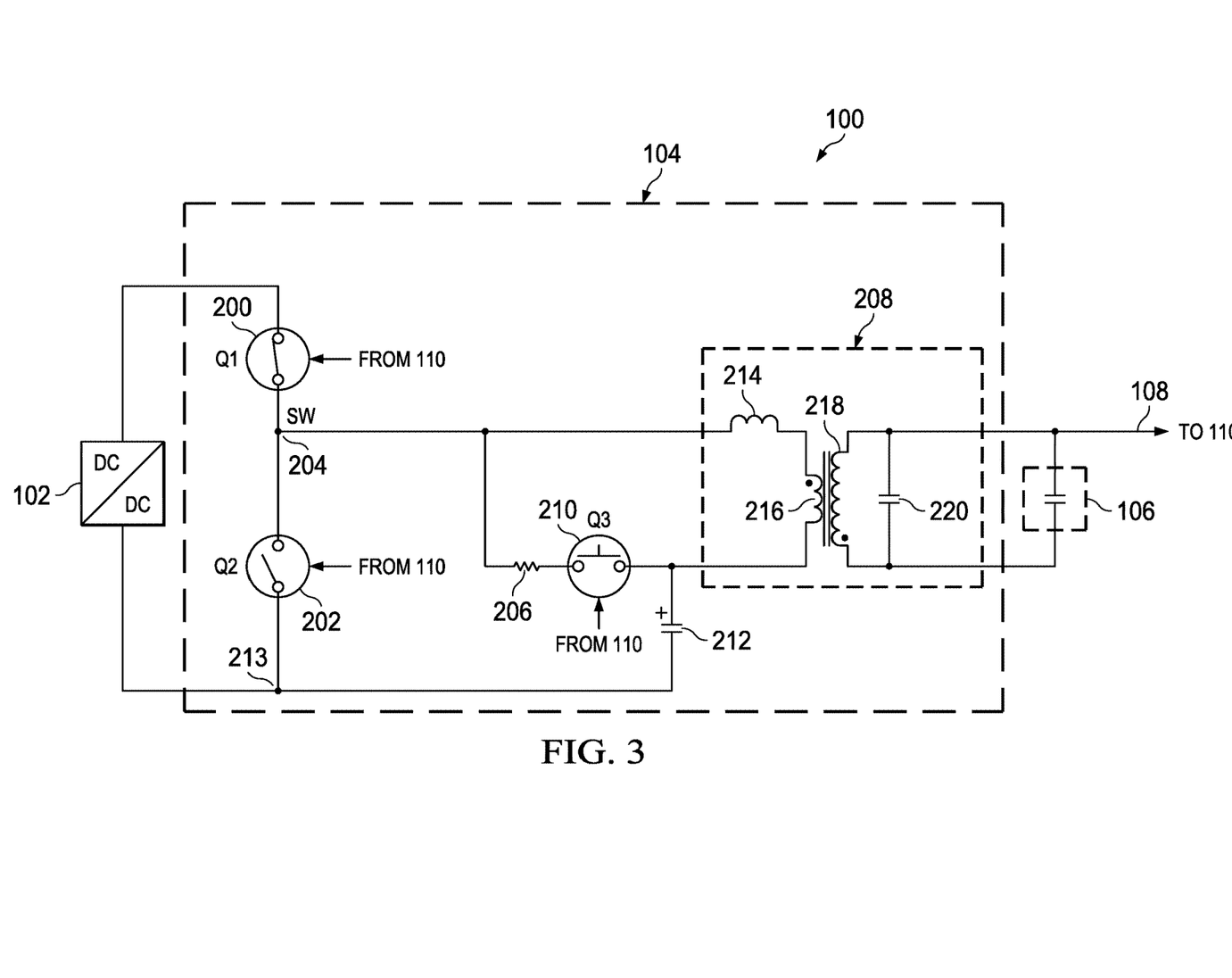
FIG. 3 is a circuit schematic diagram of a system implementing a rapid and high voltage pulse generation circuit in a first interval of operation, in accordance with various examples.

The method 900 begins with first, second and third switches of a rapid and high voltage pulse generation circuit being opened (902). In FIG. 2, the controller 110 (FIG. 1) has opened switches 200, 202, 210. The method 900 includes, for a first interval, a controller closing the first switch and keeping the second and third switches open (904). FIG. 3 is identical to FIG. 2, except that the switch 200 is now closed. Responsive to being closed, the switch 200 couples the SW node 204 to the DC power source 102. Accordingly, during interval 802 in FIG. 8, the curve 816 rises and remains high for the duration of interval 802 (e.g., as long as the switch configuration of FIG. 3 remains unchanged). The switch configuration of FIG. 3 also results in the curve 822 rising from a baseline level toward the positive peak 824, indicating that the current flowing through the SW node 204 and the primary side 216 is rising. As the current flowing through the primary side 216 increases, the output voltage across the capacitive load 106 decreases, because the primary side 216 and secondary side 218 have opposing polarities.

The method 900 includes, for a second interval, the controller opening the first switch, closing the second switch, and keeping the third switch open (906). The second interval of step 906 includes both intervals 804 and 806 in FIG. 8. Opening of the switch 200 marks the beginning of the interval 804. Thus, during interval 804, the switches 200, 202, 210 are open. Consequently, the voltage at the SW node 204 decreases, as curve 816 shows. Also, the current flowing through the SW node 204 and the primary side 216 stops rising and reaches the positive peak 824, as curve 822 shows. Thus, the on time of switch 200 controls the rise in the curve 822 during interval 802. Similarly, the output voltage across the capacitive load 106 stops decreasing, as curve 820 shows at the beginning of interval 806. During the interval 804, after the switch 200 is opened, the switch 200 acts as a capacitor and increases in charge due to the current flowing through the primary side 216. During this time, the voltage at the SW node 204 drops, but the body diode of switch 202 will prevent the voltage at the SW node 204 from decreasing below a threshold level. By the time switch 202 is closed, the voltage at the SW node 204 is already commutated, so there are little or no switching losses resulting from the switching action of the switch 202. The interval 804 thus enables efficient switching. This switching technique is called zero voltage switching (ZVS) and assumes that switch 202 closes responsive to the voltage across the switch 202 is being 0 V or within a threshold range of 0 V. In some examples, partial ZVS, rather than full ZVS, is used while still reducing switching losses. In some examples, hard switching is used in lieu of full or partial ZVS, in which case intervals 804 and 808 are reduced to zero or approximately zero.

Figure 4:
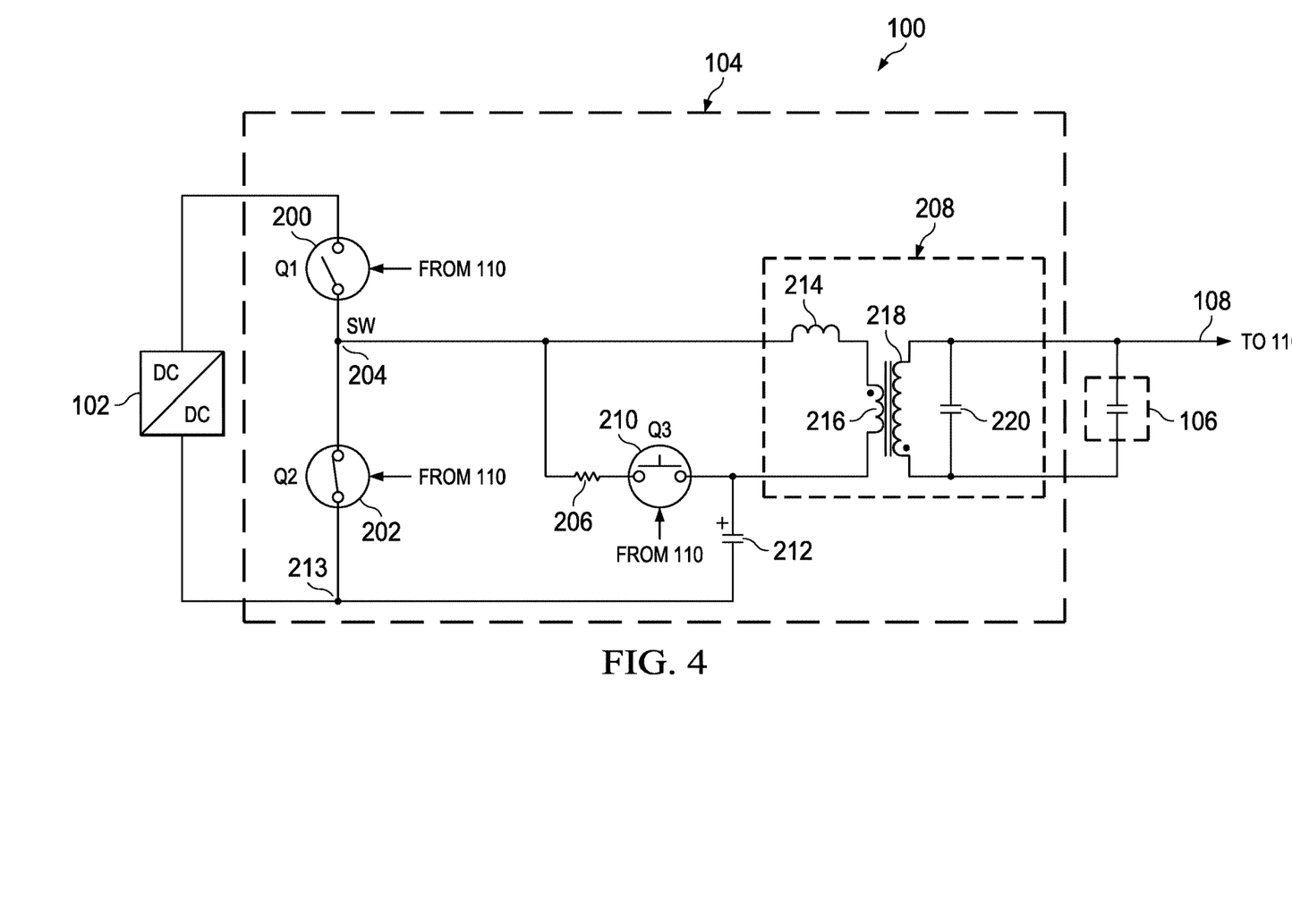
FIG. 4 is a circuit schematic diagram of a system implementing a rapid and high voltage pulse generation circuit in a second interval of operation, in accordance with various examples.

Closure of the switch 202 marks the beginning of interval 806. Interval 806 is a resonance interval. As FIG. 4 shows, the switches 200, 210 are open and switch 202 is closed, thus allowing the resonant tank of the circuit 104 (e.g., the inductor 214 and capacitor 220) to resonate or ring. The curve 822 shows the ringing activity of the current through the primary side 216, and the curve 820 shows the ringing activity of the output voltage across the capacitive load 106. The ringing activity of curve 820 produces the high-amplitude voltage pulse with fast rise time described above. Specifically, during interval 806, the rise in curve 820, the positive peak 828, and the subsequent fall in curve 820 form the targeted high-amplitude voltage pulse. The amplitude of the curve 822 at positive peak 824 determines the amplitude of the curve 820 at positive peak 828, and so adjusting the amplitude of the curve 822 at positive peak 824 (e.g., by adjusting the on time of the switch 200 during interval 802) adjusts the amplitude of the positive peak 828 to a target voltage peak. Also, as described, the high-amplitude voltage pulse has a fast rise time. Numeral 830 marks the rise of the voltage pulse of curve 820 during interval 806. The resonant frequency of the resonant tank (e.g., the inductor 214 and the combined capacitors 220, 106, and system parasitic capacitances) in the system 100 determines the slope of the curve 820 at 830 (e.g., determines the rise time of the curve 820 at 830). The resonant frequency of the resonant tank is determined by the inductance and capacitance of the transformer 208—specifically, the total inductance represented by the inductor 214 and the total capacitance represented by the capacitor 220 in combination with the capacitance of the load 106 and any system parasitic capacitances. As described above, the inductance represented by the inductor 214 may be fine-tuned upward or downward by adding or removing inductors in series and/or parallel. As also described above, the capacitance represented by the capacitor 220 may be fine-tuned upward or downward by adding or removing capacitors in series and/or parallel. By fine-tuning the inductance or capacitance of the circuit 104, the resonant frequency of the resonant tank is adjusted, which, in turn, increases or decreases the slope of curve 820 at 830 to reach a target slope (or target rate of increase). The speeds of the switches 200, 202 may also affect the slope of curve 820 at 830. To prevent the speeds of the switches 200, 202 from limiting the slope of curve 820 at 830, the switches 200, 202 may be wide-bandgap switches, such as the gallium nitride or silicon carbide switches described above.

During the resonance interval 806, energy is transferred from the primary side 216 to the secondary side 218, and a portion of this energy is transferred back from the secondary side 218 to the primary side 216. The interval 806 may continue for an extended period of time until the ringing eventually stops. However, it may be beneficial in many applications to provide the fast, high voltage pulse shown by curve 820 during interval 806, and then to prevent any further ringing in the output voltage across the capacitive load 106. It may further be beneficial to prevent such further ringing and to increase efficiency by recovering energy stored in the capacitive load 106.

Accordingly, the method 900 includes, for a third interval, the controller closing the first switch, opening the second switch, and keeping the third switch open (908). The third interval includes the intervals 808 and 810 of FIG. 8. During interval 808, the switch 202 is opened and the switches 200, 210 remain open, which causes the voltage at the SW node 204 to rise, as curve 816 shows. The inductive current in the circuit 104 commutates the SW node 204 back toward a positive voltage (e.g., toward the voltage provided by the DC power source 102), similar to the commutation described above during interval 804. In examples, the switch 202 is opened at a negative peak 826, which may be approximately equal in amplitude and opposite in polarity to the positive peak 824. Opening the switch 202 at this time prevents another resonance cycle from occurring.

Figure 5:
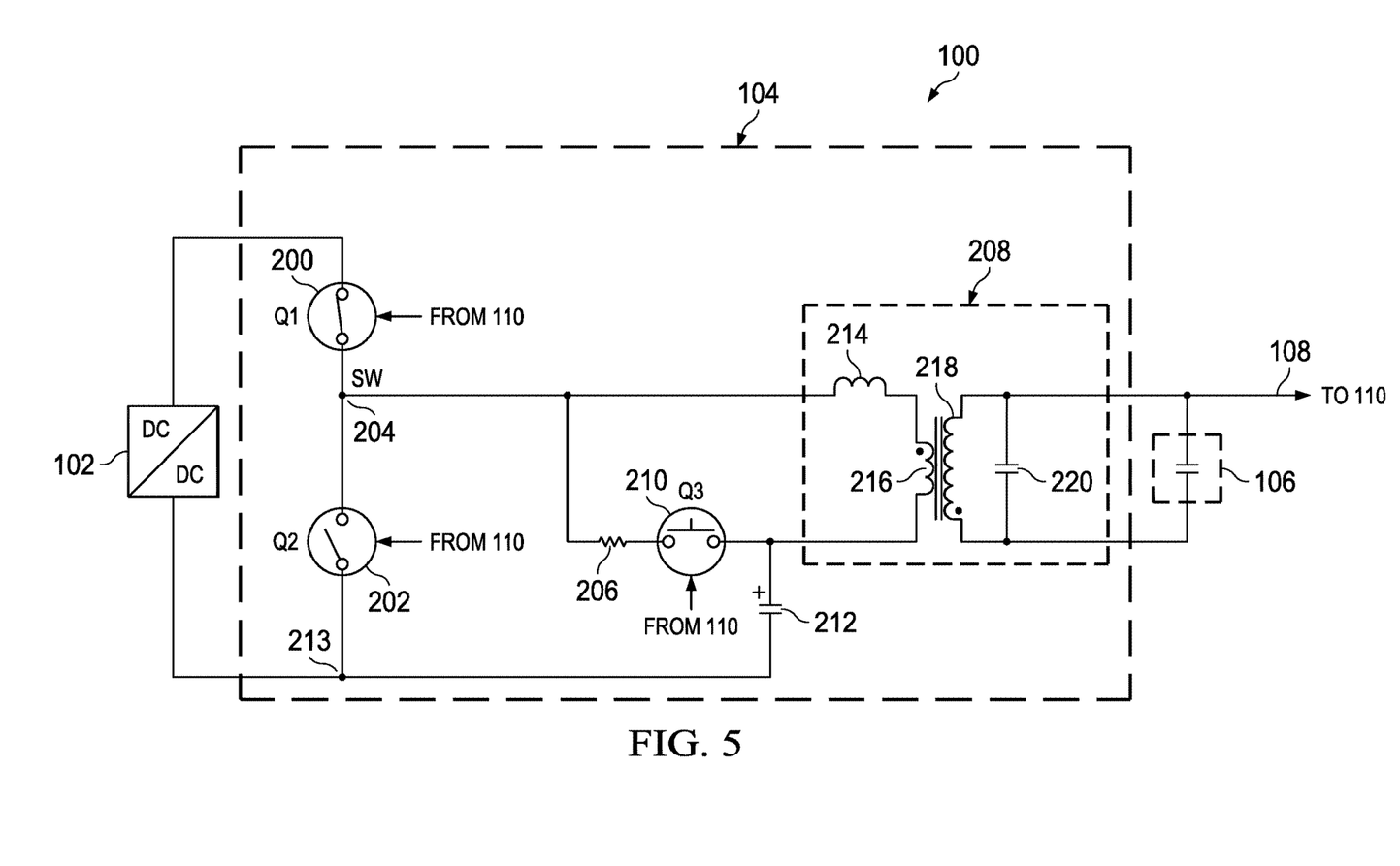
FIG. 5 is a circuit schematic diagram of a system implementing a rapid and high voltage pulse generation circuit in a third interval of operation, in accordance with various examples.

In examples, the controller 110 then closes switch 200, which marks the beginning of interval 810. Thus, as FIG. 5 shows, switch 200 is closed, and switches 202, 210 are open. The switch 200 closes with reduced switching losses due to the commutation of the SW node 204 described above. Closing the switch 200 enables the DC power source 102 to recover the resonant energy present in the secondary side 218, capacitor 220, and capacitive load 106 via the primary side 216 to an extent that is dependent on the quality of transformer coupling, with good coupling resulting in greater energy recovery and poor coupling resulting in lesser energy recovery. By recovering this resonant energy, two objectives are accomplished. First, energy is preserved, thereby increasing efficiency, which is particularly beneficial to battery-powered applications. Second, ringing that would otherwise occur after the positive peak 828 has been reached is mitigated. Curve 816 shows this recovery of resonant energy during interval 810. Also, during interval 810, the current through the primary side 216 rises, as curve 822 shows, and the output voltage across the capacitive load 106 also rises, as curve 820 shows. The high voltage at the SW node 204 during interval 810 shows the energy recovery described above.

Figure 6:
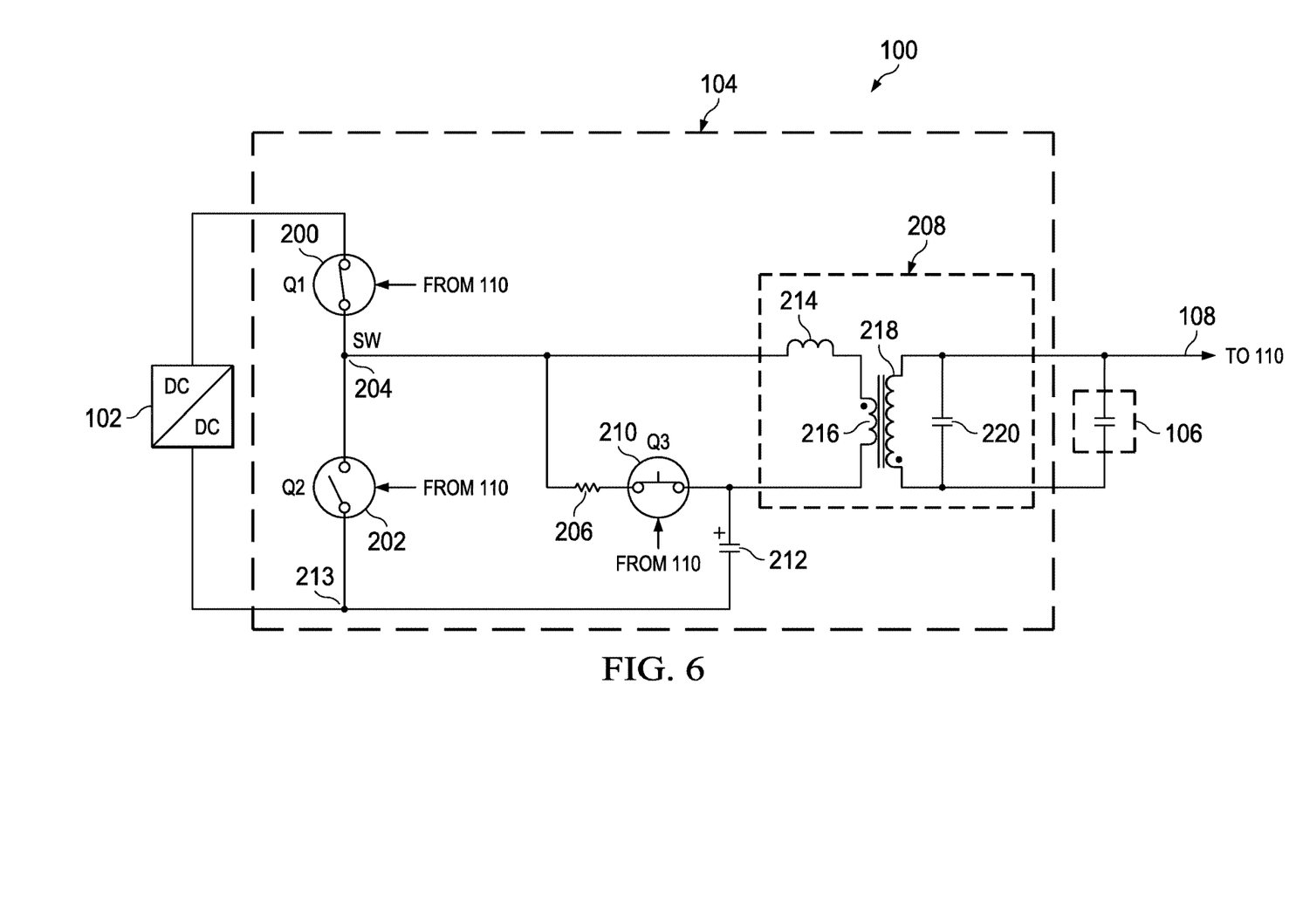
FIG. 6 is a circuit schematic diagram of a system implementing a rapid and high voltage pulse generation circuit in a fourth interval of operation, in accordance with various examples.

Although the DC power source 102 recovers some of the resonant energy as described above, at least some of the resonant energy may remain on the secondary side 218. The resonant energy on the secondary side 218 may continue ringing. The resistor 206 may dampen this ringing. Accordingly, the method 900 includes, for a fourth interval, the controller opening the first switch, keeping the second switch open, and closing the third switch (910). The fourth interval includes intervals 812 and 814 in FIG. 8. The controller 110 opens switches 200, 202, marking the beginning of the interval 812. During interval 812, the voltage at the SW node 204 decreases, as curve 816 shows. Also, during interval 812, the output voltage stops rising, as curve 820 shows, and the current through the primary side 216 stops rising, as curve 822 shows. As FIG. 6 shows, the controller 110 then closes switch 210 to mark the beginning of interval 814, which causes current to flow through the resistor 206. Any remaining resonant energy on the secondary side 218 transfers to the primary side 216, and the resistor 206 dissipates this remaining resonant energy, thus dampening any further ringing and producing stable curves 820, 822 (FIG. 8). The method 900 may then be repeated to provide another fast, high-amplitude voltage pulse, as described above.

Figure 7A:
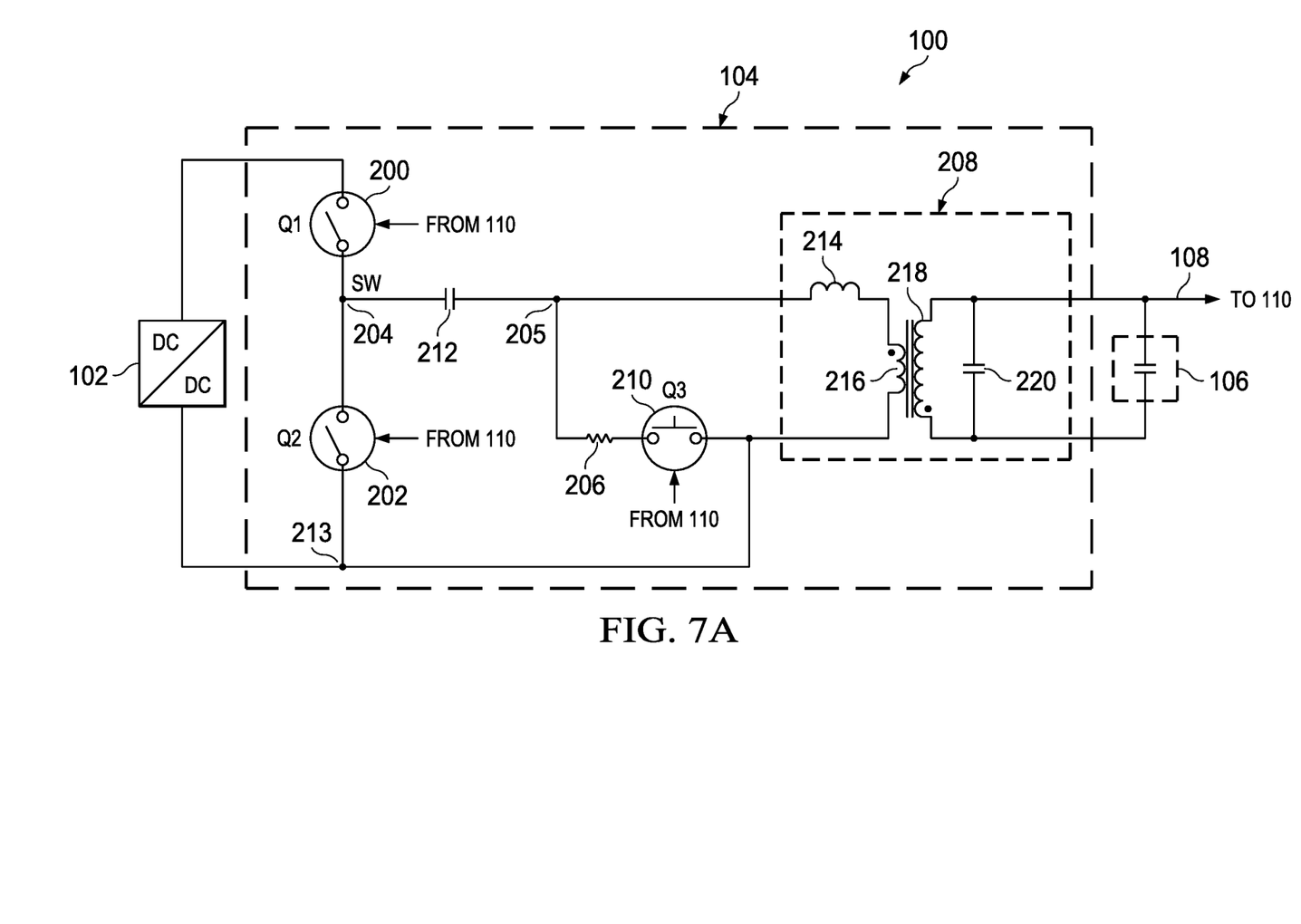
FIGS. 7A and 7B are circuit schematic diagrams of systems implementing alternative rapid and high voltage pulse generation circuits, in accordance with various examples.

FIG. 7A is a circuit schematic diagram of the system 100 that is identical to the system 100 described above, except that the capacitor 212 is relocated to a position between the SW node 204 and a node 205, where the node 205 is coupled to the resistor 206 and the inductor 214. The capacitor 212 operates as a DC blocking capacitor, which operates similarly to the capacitor 212 described above.

Figure 7B:
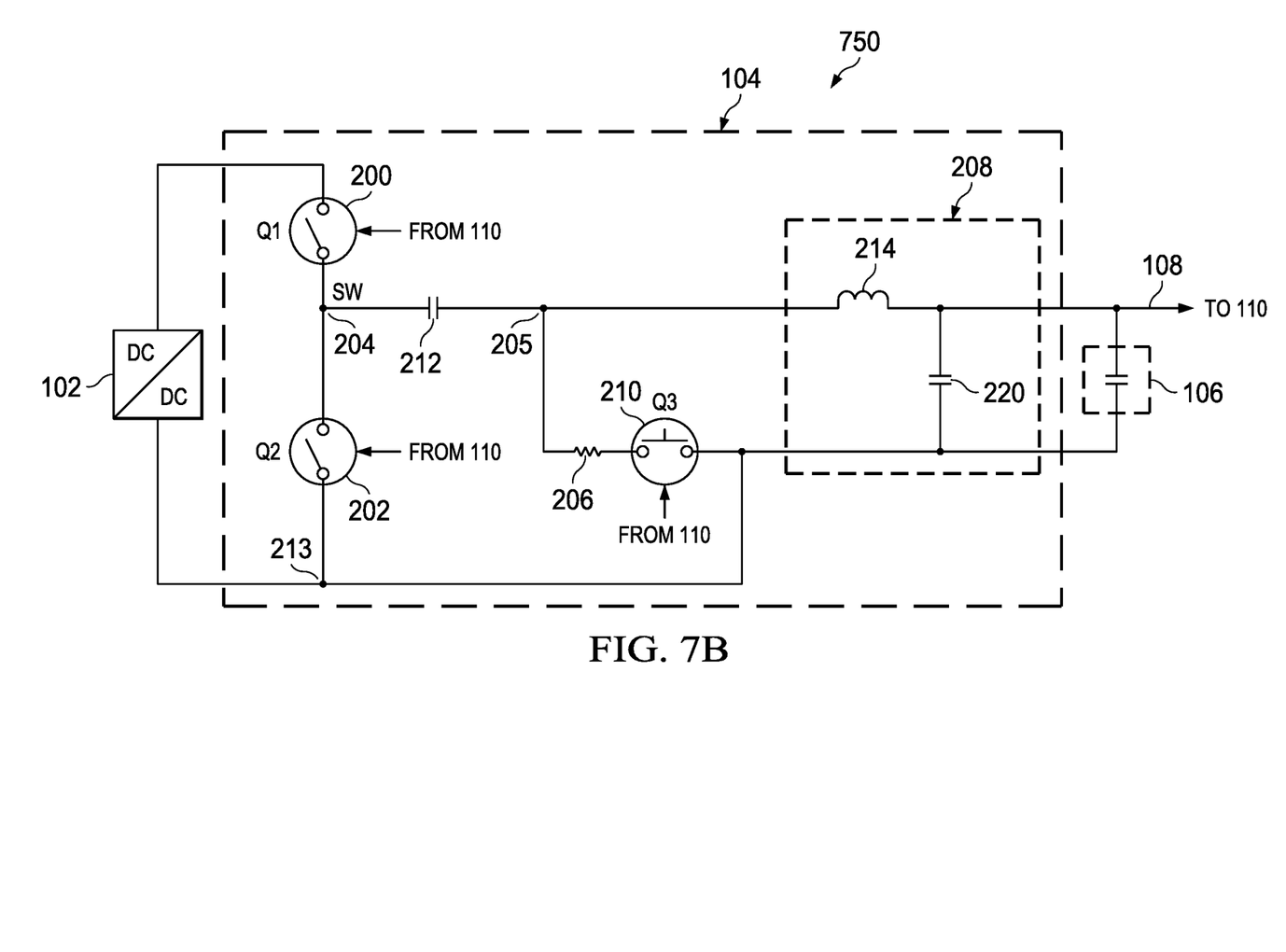

FIG. 7B is a circuit schematic diagram of a system 750 that is identical to the system 100 of FIG. 7A, except that the transformer 208 is omitted. Thus, no transformer step up, step down, or isolation features are provided. The inductor 214 couples to the capacitor 220 and capacitive load 106, as shown, and the bidirectional switch 210 also couples to the capacitor 220 and capacitive load 106, as shown. The system 750 operates similarly to the system 100, except that the current flow through the inductor 214 is identical to that in the capacitive load 106. Also, energy recovery is made more efficient due to elimination of transformer coupling problems. However, ringing may occur due to residual energy in the system 750 (e.g., secondary to signal timing errors), and the resistor 206 is configured to dampen such ringing in the manner described above.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A circuit, comprising:
   a first switch adapted to be coupled to a direct current (DC) power source;
   a second switch coupled to the first switch and adapted to be coupled to the DC power source;
   a resistor coupled to the first and second switches;
   a transformer having a primary side and a secondary side, the primary side coupled to the first and second switches, the secondary side adapted to be coupled to a load;

a third switch coupled between the resistor and the primary side of the transformer; and
a capacitor coupled to the second switch.

2. The circuit of claim 1, wherein the first switch, the second switch, and the primary side of the transformer are adapted to be coupled to an inductor.

3. The circuit of claim 1, wherein the capacitor is a first capacitor, and the circuit includes a second capacitor coupled in parallel with the secondary side of the transformer.

4. The circuit of claim 1, wherein the primary and secondary sides of the transformer have opposing polarities.

5. The circuit of claim 1, wherein the transformer is an isolation step-up transformer.

6. The circuit of claim 1, wherein the third switch is a bidirectional switch.

7. The circuit of claim 1, wherein the first and second switches are field effect transistors (FETs) including one of gallium nitride or silicon carbide.

8. A circuit, comprising:
a first switch having a terminal, the first switch adapted to be coupled to a direct current (DC) power source;
a second switch coupled to the terminal and adapted to be coupled to the DC power source;
a resistor coupled to the terminal; and
a transformer having a primary side and a secondary side, the primary side coupled to the terminal and to a third switch, the third switch coupled to the resistor, the secondary side adapted to be coupled to a load;
the first switch configured to cause a voltage at the terminal to increase during a first interval, causing an increase in a current through the primary side of the transformer, and
the second switch configured to cause the voltage at the terminal to decrease, causing the current through the primary side of the transformer to resonate during a second interval, the resonance causing a voltage across the secondary side of the transformer to increase at a target rate and to reach a target voltage peak, the target rate based on a resonant frequency of the circuit and the load, the target voltage peak based on a current peak in the current through the primary side of the transformer.

9. The circuit of claim 8, wherein the first switch is configured to cause the voltage at the terminal to increase during a third interval, causing the current through the primary side of the transformer to increase.

10. The circuit of claim 9, wherein the first switch is configured to close when the current through the primary side of the transformer is approximately equal in amplitude and opposite in polarity to the current peak.

11. The circuit of claim 9, wherein the first switch is configured to cause energy in the circuit to be stored to the DC power source.

12. The circuit of claim 8, wherein the third switch and the resistor are configured to dissipate energy in the circuit during a fourth interval.

13. The circuit of claim 8, wherein the third switch is a bidirectional switch.

14. The circuit of claim 8, wherein the transformer is a step-up transformer, and the primary and secondary sides of the transformer have opposing polarities.

15. The circuit of claim 8, wherein the first and second switches include either gallium nitride or silicon carbide.

16. A system, comprising:
a controller;
a direct current (DC) power source;
a capacitive load; and
a circuit coupled to the controller, the DC power source, and the capacitive load, the circuit including:
a first transistor having a terminal, the first transistor coupled to the controller and to the DC power source;
a second transistor coupled to the first transistor at the terminal, the second transistor coupled to the controller and to the DC power source;
a resistor coupled to the terminal;
a bidirectional switch coupled to the resistor; and
a transformer having a primary side and a secondary side, the primary side coupled to the terminal and to the bidirectional switch, the secondary side coupled in parallel to the capacitive load.

17. The system of claim 16, wherein the controller is configured to control the first and second transistors and the bidirectional switch at fixed time intervals.

18. The system of claim 16, further comprising a capacitor in parallel with the secondary side of the transformer and in parallel with the capacitive load.

19. The system of claim 16, further comprising a capacitor coupled to the bidirectional switch, the second switch, the DC power source, and the primary side of the transformer.

20. The system of claim 16, further comprising a capacitor coupled to the first and second transistors and to the primary side of the transformer.

* * * * *